(12) United States Patent
Liu et al.

(10) Patent No.: US 8,552,974 B2
(45) Date of Patent: Oct. 8, 2013

(54) HAPTIC FEEDBACK DEVICE

(75) Inventors: Lin Liu, Shenzhen (CN); Jie He, Shenzhen (CN); Zheng-Ping Qin, Shenzhen (CN)

(73) Assignees: AAC Acoustic Technologies (Shenzhen) Co., Ltd., Shenzhen (CN); American Audio Components Inc., La Verne, CA (US)

( * ) Notice: Subject to any disclaimer, the term of this patent is extended or adjusted under 35 U.S.C. 154(b) by 483 days.

(21) Appl. No.: 12/855,440

(22) Filed: Aug. 12, 2010

(65) Prior Publication Data

US 2011/0157002 A1    Jun. 30, 2011

(30) Foreign Application Priority Data

Dec. 31, 2009  (CN) .................. 2009 2 0296812 U

(51) Int. Cl.
*G09G 5/00* (2006.01)
(52) U.S. Cl.
USPC .......................................... 345/156

(58) Field of Classification Search
USPC .......................................... 345/156
See application file for complete search history.

(56) References Cited

U.S. PATENT DOCUMENTS

| | | | | |
|---|---|---|---|---|
| 2006/0012559 A1* | 1/2006 | Kang | ............................. | 345/108 |
| 2007/0013270 A1* | 1/2007 | Sashida et al. | ................ | 310/348 |
| 2009/0174672 A1* | 7/2009 | Schmidt | ........................ | 345/173 |

* cited by examiner

*Primary Examiner* — Dwayne Bost
*Assistant Examiner* — Yungsang Lau
(74) *Attorney, Agent, or Firm* — IPro, Inc.; Na Xu

(57) ABSTRACT

A haptic feedback device includes a screen and a piezoelectric vibrator partially connected with the screen. The screen includes a display viewing area and a frame surrounding the display viewing area. The piezoelectric vibrator engaged with the screen defines a moving portion having a projecting portion extending toward the screen. The screen defines a cavity and the projecting portion of the piezoelectric vibrator is at least partially accommodated in the cavity.

11 Claims, 1 Drawing Sheet

HAPTIC FEEDBACK DEVICE

FIELD OF THE INVENTION

The present invention relates generally to haptic feedback devices, and more particularly to a haptic feedback device having a vibrator directly assembled with a screen thereof.

RELATED ART OF THE INVENTION

Haptic feedback is widely used in portable electronic devices.

As disclosed in U.S. Pat. No. 7,535,454 B2, portable electronic devices, such as mobile phones, portable GPS navigations, laptop computers, generally have a number of buttons that allow a user to interface with the devices by inputting information. The capabilities of these devices are increasing while the size and weight are decreasing to enhance portability. For example, mobile phones, in addition to their traditional role as voice-communication devices, now include functions traditionally associated with other devices, such as electronic games, PDAs, and digital cameras.

To permit effective interaction with the handheld devices, the handheld devices typically provide visual and aural cues or feedback. In addition to conventional visual and aural feedback, some of these devices attempt to enhance the effectiveness of device feedback by providing tactile cues or feedback. Some devices utilize structural tactile methods. One such example is to provide raised surfaces on the input surface, e.g., a keypad, of the device. Such methods, however, are inherently static and thus cannot offer effective tactile feedback.

Active methods of providing tactile feedback include incorporating a vibrator into the handheld electronic devices. Such a method of providing haptic cues, however, generally vibrates the entire device. Such method or apparatuses are disclosed in U.S. Pat. No. 7,535,454 B2, U.S. Pat. No. 7,148,875 B2, U.S. Pat. No. 6,853,965 B2, U.S. Pat. No. 6,429,846 B2, U.S. Pat. No. 6,405,158 B2.

So, it is necessary to provide a new haptic feedback device.

SUMMARY OF THE INVENTION

In an exemplary embodiment of the present invention, a haptic feedback device comprises a screen and a piezoelectric vibrator engaged with the screen. The screen comprises a display viewing area and a frame surrounding the display viewing area. The piezoelectric vibrator defines a moving portion provided with a projecting portion extending toward the screen. The screen further defines a cavity and the projecting portion of the piezoelectric vibrator is at least partially accommodated in the cavity.

Other features and advantages of the present invention will become more apparent to those skilled in the art upon examination of the following drawings and detailed description of an exemplary embodiment.

DETAILED DESCRIPTION OF THE EXEMPLARY EMBODIMENTS

Reference will now be made to describe an exemplary embodiment of the present invention in detail.

The present invention is presented for providing the user with intensive interaction experience. For example, if a user taps on a touch screen of a portable gaming, the user will get a tactile feedback, such as vibration, from the touch screen.

Figure 1:
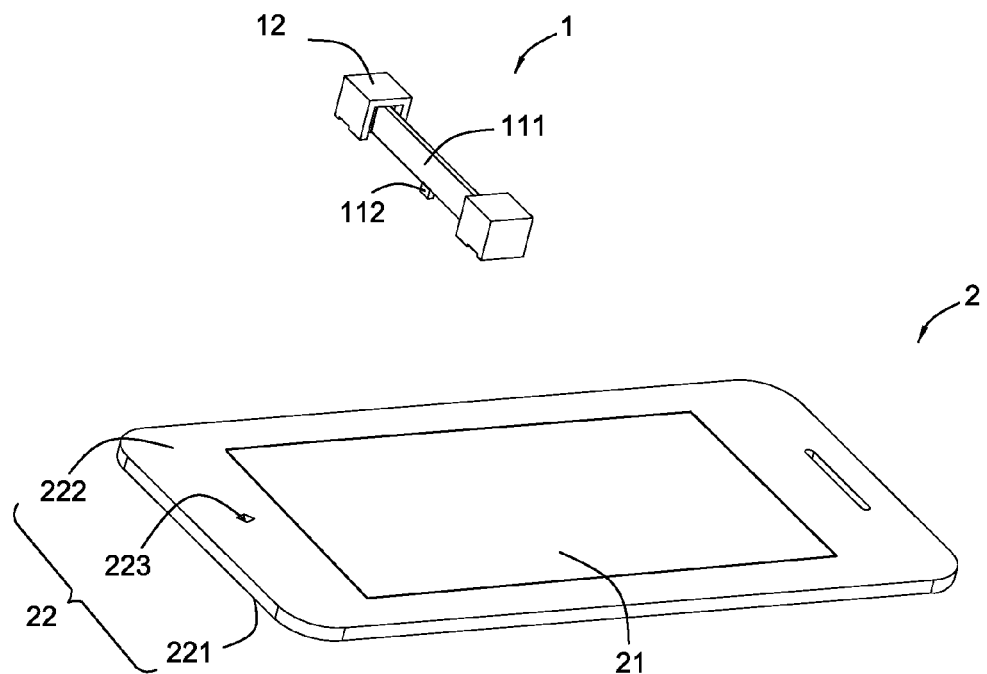
FIG. 1 is an exploded view of a haptic feedback device in accordance with an exemplary embodiment of the present invention.
Figure 2:
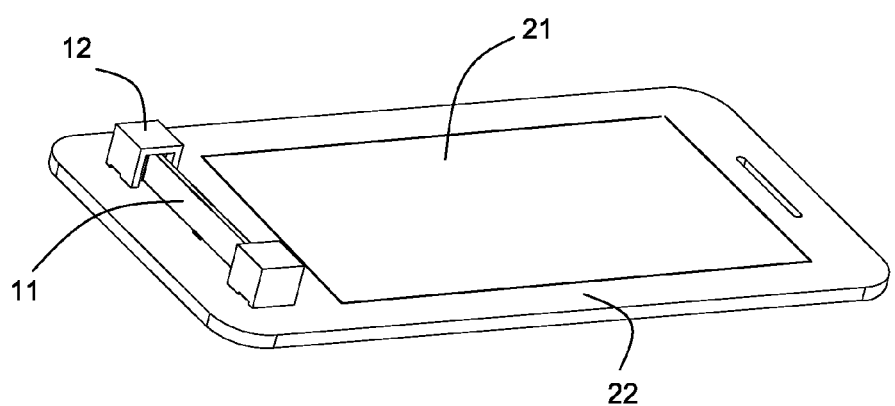
FIG. 2 is an isometric assembled view of the haptic feedback device in FIG. 1.

Referring to FIGS. 1 and 2, a haptic feedback device in accordance with an exemplary embodiment of the present invention comprises a screen 2 and a piezoelectric vibrator 1 engaged with the screen 2. The piezoelectric vibrator 1 vibrates along a direction parallel to the screen 2.

The screen 2 comprises a display viewing area 21 and a frame 22 surrounding the display viewing area 21. The frame 22 defines a first surface 221, a second surface 222 opposite to the first surface 221 and a cavity 223 extending from the second surface 222 toward the first surface 221.

The piezoelectric vibrator 1 defines a moving portion 11 and a pair of supporting portions 12 positioned at two ends of the moving portion 11. The moving portion 11 comprises a pair of ceramic plates 111 and a projecting portion 112 sandwiched between the ceramic plates 111. The projecting portion 112 extends from a middle portion of the moving portion 11 toward the screen 2.

A piezoelectric vibrator is a type of electric motor based upon the change in shape of a piezoelectric material when an electric field is applied. Piezoelectric vibrators make use of the converse piezoelectric effect whereby the material produces vibrations in order to produce a motion.

While assembled, the piezoelectric vibrator is mounted on the frame 22 of the screen 2 and the projecting portion 112 is at least partially engaged with the cavity 223 of the frame 22, whereby the vibration of the piezoelectric vibrator 1 is transmitted to the screen 2 by virtue of the cooperation of the projecting portion 112 and the cavity 223. Preferably, the projecting portion 112 comprises the material of metal. The vibrating direction of the moving portion 11 is parallel to the screen 2.

Although metal is used as the material of the projecting portion in the above embodiment, the material of the projecting portion is not limited to metal. Although configured to be sandwiched between two ceramic plates 111 in the exemplary embodiment, the projecting portion 112 may directly extends from a side of the moving portion 11 of the piezoelectric vibrator 1. Although the cavity 223 is configured to be located in the frame 22 in the exemplary embodiment, it may be defined in other part of the screen 2, e.g., in the display viewing area 21.

According to the aforementioned haptic feedback device, the vibration produced by the piezoelectric vibrator is directly transmitted to the screen, and force feedback from the screen is generated rapidly due to the cooperation between the cavity and the projecting portion accommodated in the cavity. And as it is easier to define a cavity in the screen, so the manufacture of the haptic feedback device is simple and low-cost.

While the present invention has been described with reference to a specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. A haptic feedback device comprising:
   a screen comprising a display viewing area and a frame surrounding the display viewing area;
   a piezoelectric vibrator engaged with the screen to cause vibration along a direction parallel to the screen,
   wherein the piezoelectric vibrator is arranged to contain a pair of supporting portions positioned at two ends of a moving portion, the moving portion having a projecting portion extending from the moving portion toward the screen;

wherein, the screen defines a cavity and the projecting portion of the piezoelectric vibrator is at least partially accommodated in the cavity.

2. The haptic feedback device as described in claim 1, wherein the projecting portion comprises material of metal.

3. The haptic feedback device as described in claim 1, wherein the moving portion of the piezoelectric vibrator defines a pair of ceramic plates, and the projecting portion is sandwiched between the ceramic plates.

4. The haptic feedback device as described in claim 1, wherein the projecting portion extends from a side of the moving portion of the piezoelectric vibrator.

5. The haptic feedback device as described in claim 1, wherein the cavity is located in the frame.

6. The haptic feedback device as described in claim 1, wherein the projecting portion projects from a center of the moving portion.

7. The haptic feedback device as described in claim 1, wherein the moving portion is parallel to the screen.

8. A haptic feedback device comprising:
a screen;
a piezoelectric vibrator being capable of vibrating along a direction parallel to the screen, the piezoelectric vibrator defining a moving portion parallel to the screen;
wherein the piezoelectric vibrator is arranged to contain a pair of supporting portions positioned at two ends of the moving portion;
a complementary conformation defined between the screen and the moving portion for transmitting the vibration of the piezoelectric vibrator directly to the screen.

9. The haptic feedback device as described in claim 8, wherein the complementary conformation includes a cavity in the screen and a projecting portion extending from the moving portion toward the screen for accommodating in the cavity.

10. The haptic feedback device as described in claim 9, wherein the screen includes a display viewing area and a frame surrounding the display viewing area, and the cavity is configured in the frame.

11. The haptic feedback device as described in claim 9, wherein the moving portion includes a pair of ceramic plates for sandwiching the projecting portion.

\* \* \* \* \*